US008815739B2

(12) United States Patent
Krivokapic et al.

(10) Patent No.: US 8,815,739 B2
(45) Date of Patent: Aug. 26, 2014

(54) FINFET DEVICE WITH A GRAPHENE GATE ELECTRODE AND METHODS OF FORMING SAME

(75) Inventors: Zoran Krivokapic, Santa Clara, CA (US); Bhagawan Sahu, Watervliet, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 9 days.

(21) Appl. No.: 13/545,621

(22) Filed: Jul. 10, 2012

(65) Prior Publication Data

US 2014/0015015 A1    Jan. 16, 2014

(51) Int. Cl.
    *H01L 21/20*    (2006.01)
(52) U.S. Cl.
    USPC ............. 438/689; 438/142; 438/17; 438/478; 438/34; 438/151; 257/29; 257/410; 257/288; 257/365; 257/19; 257/E21.09; 257/E21.531; 257/E29.255; 257/E29.262; 257/E21.409
(58) Field of Classification Search
    CPC ............. H01L 29/785; H01L 29/1606; H01L 29/66015
    USPC .......... 365/185; 257/255, 19, 9, 365, 401, 26, 257/330, E21.09, E21.531, E29.255, 257/E29.262, E29.168; 427/58, 122
    See application file for complete search history.

(56) References Cited

U.S. PATENT DOCUMENTS

| 6,623,893 | B1 | 9/2003 | Lyons et al. | |
|---|---|---|---|---|
| 6,639,650 | B2 | 10/2003 | Shirasaki | |
| 7,109,516 | B2 * | 9/2006 | Langdo et al. | 257/19 |
| 7,628,865 | B2 | 12/2009 | Singh | |
| 7,851,109 | B2 | 12/2010 | Chakravorty et al. | |
| 7,875,863 | B2 | 1/2011 | Van Herpen et al. | |
| 8,048,474 | B2 * | 11/2011 | Kumar et al. | 427/58 |
| 2003/0073795 | A1 | 4/2003 | Araki et al. | |
| 2005/0280103 | A1 * | 12/2005 | Langdo et al. | 257/401 |
| 2008/0137049 | A1 | 6/2008 | Jasper et al. | |
| 2009/0258135 | A1 * | 10/2009 | Kumar et al. | 427/122 |
| 2010/0270619 | A1 * | 10/2010 | Lee | 257/365 |
| 2011/0063601 | A1 | 3/2011 | Kim et al. | |
| 2011/0065278 | A1 | 3/2011 | Kim | |
| 2011/0193141 | A1 * | 8/2011 | Lin et al. | 257/255 |
| 2011/0210308 | A1 * | 9/2011 | Kim et al. | 257/9 |
| 2012/0281484 | A1 * | 11/2012 | Cho et al. | 365/185.28 |

OTHER PUBLICATIONS

Bae et al., "Roll-to-roll production of 30-inch graphene films for transparent electrodes," Nature Nanotechnology, vol. 5, pp. 574-578, Aug. 2010.

Coleman et al., "Two-Dimensional Nanosheets Produced by Liquid Exfoliation of Layered Materials," Science, vol. 331, pp. 568-571, Feb. 4, 2011.

Lee et al., "Optical response of large scale single layer graphene," Applied Physics Letters, 98, 071905, 2011.

(Continued)

*Primary Examiner* — Jerome Jackson, Jr.
*Assistant Examiner* — Bo Fan
(74) *Attorney, Agent, or Firm* — Amerson Law Firm, PLLC

(57) ABSTRACT

One illustrative device disclosed herein includes at least one fin comprised of a semiconducting material, a layer of gate insulation material positioned adjacent an outer surface of the fin, a gate electrode comprised of graphene positioned on the layer of gate insulation material around at least a portion of the fin, and an insulating material formed on the gate electrode.

14 Claims, 12 Drawing Sheets

(56) References Cited

OTHER PUBLICATIONS

Liu et al., "Direct Growth of Graphene/Hexagonal Boron Nitride Stacked Layers," Nano Letters, vol. 11, pp. 2032-2037, Apr. 13, 2011.

Pacile et al., "The two-dimensional phase of boron nitride: Few-atomic-layer sheets and suspended membranes," Applied Physics Letters, 92, 133107, 2008.

Schroff et al., "High transmission pellicles for extreme ultraviolet lithography reticle protection," J. Vac. Sci. Technol., B 28(6), pp. C6E36-41, -Nov./Dec. 2010.

Song et al., "Large Scale Growth and Characterization of Atomic Hexagonal Boron Nitride Layers," Nano Letters, received for review Jun. 23, 2010.

Yamaguchi et al., "Highly Uniform 300 mm Wafer-Scale Deposition of Single and Multilayered Chemically Derived Graphene Thin Films," ACS NANO, vol. 4, No. 1, pp. 524-528, Jan. 5, 2010.

Felch et al., "Comparison of Ultra-Shallow Junctions with PLAD and Beamline Implantation," Varian Semiconductor Equipment Associates, Inc., 2007.

Renau and Scheuer, "Comparison of Plasma Doping and Beamline Technologies for Low Energy Ion Implantation," Varian Semiconductor Equipment Associates, Inc., 2002.

Rubin and Poate, "Ion Implantation in Silicon Technology," The Industrial Physicist, pp. 12-15, Jun./Jul. 2003.

\* cited by examiner

FINFET DEVICE WITH A GRAPHENE GATE ELECTRODE AND METHODS OF FORMING SAME

BACKGROUND OF THE INVENTION

1. Field of the Invention

Generally, the present disclosure relates to the manufacture of sophisticated semiconductor devices, and, more specifically, to a FinFET device with a gate electrode comprised of graphene and various methods of forming such FinFET devices.

2. Description of the Related Art

The fabrication of advanced integrated circuits, such as CPU's, storage devices, ASIC's (application specific integrated circuits) and the like, requires the formation of a large number of circuit elements in a given chip area according to a specified circuit layout, wherein so-called metal oxide field effect transistors (MOSFETs or FETs) represent one important type of circuit element that substantially determines performance of the integrated circuits. A FET is a planar device that typically includes a source region, a drain region, a channel region that is positioned between the source region and the drain region, and a gate electrode positioned above the channel region.

To improve the operating speed of FETs, and to increase the density of FETs on an integrated circuit device, device designers have greatly reduced the physical size of FETs over the years. More specifically, the channel length of FETs has been significantly decreased, which has resulted in improving the switching speed of FETs. However, decreasing the channel length of a FET also decreases the distance between the source region and the drain region. In some cases, this decrease in the separation between the source and the drain makes it difficult to efficiently inhibit the electrical potential of the source region and the channel from being adversely affected by the electrical potential of the drain. This is sometimes referred to as a so-called short channel effect, wherein the characteristic of the FET as an active switch is degraded. Due to rapid advances in technology of the past several years, the channel length of FET devices has become very small, e.g., 20 nm or less, and further reductions of the channel length are desired and perhaps anticipated, e.g., channel lengths of approximately 10 nm or less are anticipated in future device generations.

In contrast to a FET, which has a planar structure, there are so-called 3D devices, such as an illustrative FinFET device, which is a 3-dimensional structure. More specifically, in a FinFET, a generally vertically positioned fin-shaped active area is formed and a gate electrode encloses both sides and an upper surface of the fin-shaped active area to form a tri-gate structure so as to use a channel having a 3-dimensional structure instead of a planar structure. In some cases, an insulating cap layer, e.g., silicon nitride, is positioned at the top of the fin and the FinFET device only has a dual-gate structure. Unlike a planar FET, in a FinFET device, a channel is formed perpendicular to a surface of the semiconducting substrate so as to reduce the physical size of the semiconductor device. Also, in a FinFET, the junction capacitance at the drain region of the device is greatly reduced, which tends to reduce at least some short channel effects.

With respect to either a FET or a FinFET, threshold voltage is an important characteristic of a transistor. Simplistically, a transistor can be viewed as a simple ON-OFF switch. The threshold voltage of a transistor is the voltage level above which the transistor is turned "ON" and becomes conductive. That is, if the voltage applied to the gate electrode of the transistor is less than the threshold voltage of the transistor, then there is no current flow through the channel region of the device (ignoring undesirable leakage currents, which are relatively small). However, when the voltage applied to the gate electrode exceeds the threshold voltage, the channel region becomes conductive, and electrical current is permitted to flow between the source region and the drain region through the conductive channel region.

There are many situations where it would be desirable to have the ability to produce transistor devices with different threshold voltages. For example, low threshold voltage levels are desirable in devices in the critical path of a circuit because such devices must operate at very high speeds and they need to be able to drive a lot of current. As another example, it is desirable that the devices used to make an SRAM device have a relatively high threshold voltage so that the standby power consumption for the SRAM device is relatively low. The capability of producing integrated circuit products with transistors that have differing threshold voltages will provide circuit designers with increased flexibility in designing increasingly complex integrated circuit products.

Various techniques have been employed in attempts to vary or control the threshold voltages of transistor devices. One technique involves introducing different dopant levels into the channel regions of different transistors in an effort to produce devices having different threshold voltages. However, given the very small channel length on current and future device generations, e.g., 10 nm gate length, it is very difficult to uniformly dope such a small area of the substrate due to inherent variations in the ion implanting process that are typically performed to introduce such dopant materials. As a result of lack of uniformity in the channel doping, this technique has resulted in devices having reduced performance capability and/or undesirable or unacceptable variations in the threshold voltage of such devices as compared to desired or target threshold voltages of such devices.

Another technique for manufacturing devices having different threshold voltage levels involves including so-called work-function adjusting metals, such as lanthanum, aluminum and the like, as part of the gate structures of various devices, i.e., N-channel transistors and P-channel transistors, respectively. However, as the gate length of the transistors has decreased, it has become increasingly more challenging to effectively and efficiently incorporate such additional materials into the gate structure. Even if there is sufficient room for such additional work-function adjusting materials, the fabrication of such devices is extremely complex and time consuming.

The present disclosure is directed to various methods of forming FinFET devices that may solve or at least reduce one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to a FinFET device with a gate electrode comprised of graphene and various methods of forming such FinFET devices. One illustrative device disclosed herein includes at least one fin comprised of a semiconducting material, a layer of gate insulation material positioned adjacent an outer surface of the fin, a gate electrode comprised of graphene positioned on the layer of gate insulation material around at least a portion of the fin and, an insulating material formed on the gate electrode.

One illustrative method disclosed herein involves forming at least one fin in a semiconducting substrate, forming a layer of gate insulation material adjacent the fin, forming a gate electrode comprised of graphene, wherein at least the layer of gate insulation material is positioned between the gate electrode and the fin, and forming an insulating material on the gate electrode. In some embodiments, the step of forming the layer of gate insulation material is performed prior to the step of forming the gate electrode, while, in other embodiments, the step of forming the layer of gate insulation material is performed after the step of forming the gate electrode.

BRIEF DESCRIPTION OF THE DRAWINGS

The disclosure may be understood by reference to the following description taken in conjunction with the accompanying drawings, in which like reference numerals identify like elements, and in which.

Figure 1A:
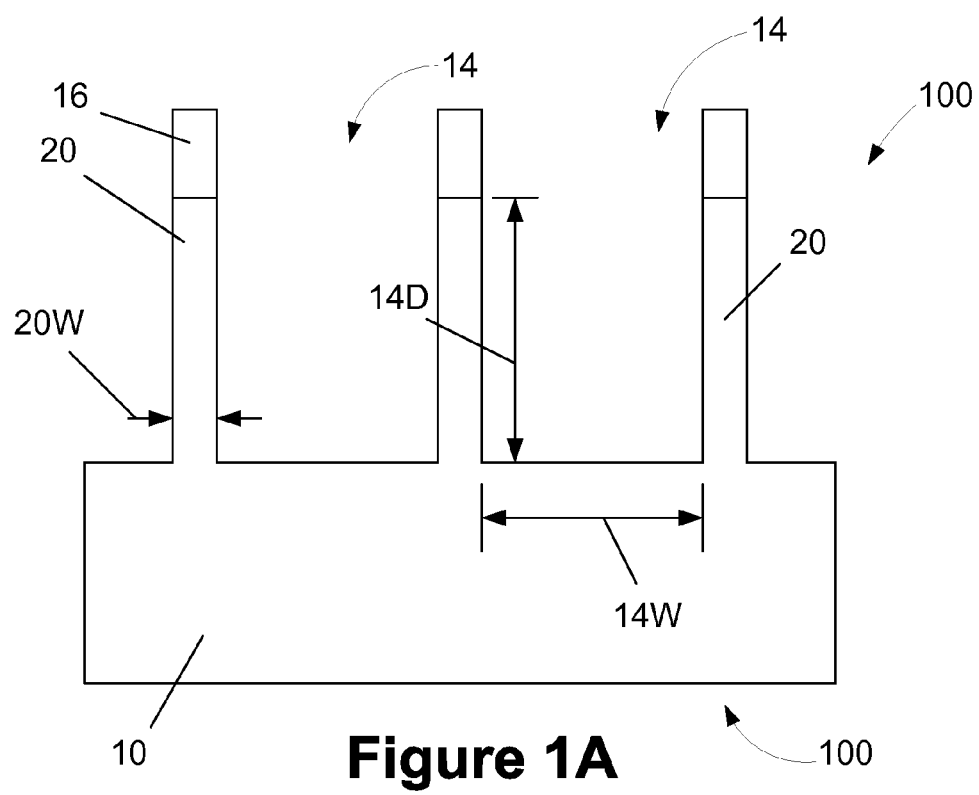
FIGS. 1A-1F depict one illustrative method disclosed herein of forming a FinFET device with a gate electrode comprised of graphene.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to a FinFET device with a gate electrode comprised of graphene and various methods of forming such FinFET devices. As will be readily apparent to those skilled in the art upon a complete reading of the present application, the present method is applicable to a variety of devices, including, but not limited to, logic devices, memory devices, etc. Moreover, the techniques disclosed herein may be employed to form N-type and/or P-type FinFET devices. With reference to the attached figures, various illustrative embodiments of the methods and devices disclosed herein will now be described in more detail.

FIGS. 1A-1F depict one illustrative method disclosed herein of forming a FinFET device 100 with a gate electrode comprised of one or more monolayers of graphene. In a FinFET device, the height or thickness of the gate electrode is a very important characteristic because the greater the height or thickness of the gate electrode, the greater the magnitude of parasitic gate-to-source and gate-to-drain capacitances. In general, the formation of a FinFET device involves the formation of one or more fins in a semiconducting substrate. As will be understood by those skilled in the art after a complete reading of the present application, the fins for the FinFET devices disclosed herein may be manufactured using any desired technique. For example, the fins may be formed prior to filling various trenches that will eventually become isolation structures for the FinFET device with an insulating material. The fins may also be formed using a so-called damascene-like technique. In the damascene-like technique, a plurality of trenches are formed in the substrate that defines the fins and the isolation trenches, all of the trenches are filled with an insulating material, an etch mask is formed to cover the isolation regions while exposing the region where the fins will be formed, and an etch process is performed that is non-selective relative to the substrate and the insulating material. The non-selective etch process is performed for a sufficient duration such that a portion of the thickness of the layer of insulating material in the fin region is removed which thereby exposes the fins to the desired height. Thus, the present invention should not be considered as limited to any particular technique for manufacturing the fins of a FinFET device.

FIG. 1A is a simplified view of an illustrative FinFET semiconductor device 100 that is formed in and above an illustrative semiconducting substrate 10. The substrate 10 may have a variety of configurations, such as the depicted bulk configuration, or it may have other configurations, such as, for example, a so-called silicon-on-insulator (SOI) configuration. The substrate (or at least the fins) 10 may be made of silicon or they may be made of any other semiconductor material, such as silicon, silicon/germanium, a III-V compound semiconductor material, a II-VI compound semiconductor material, or silicon/carbon or combinations thereof, etc. FIG. 1A depicts the illustrative FinFET device 100 at the point of fabrication wherein a patterned mask layer 16, such as a patterned hard mask layer, has been formed above the substrate 10 using known photolithography and etching techniques. Thereafter, an etching process, such as a dry or wet etching process, is then performed on the substrate 10 through the patterned mask layer 16 to form a plurality of trenches 14. This etching process results in the definition of a plurality of fins 20. In some applications, a further etching process may be performed to reduce the width or to "thin" the fins 20, although such a thinning process is not depicted in the attached drawings. For purposes of this disclosure and the claims, the use of the terms "fin" or "fins" should be understood to refer to fins that have not been thinned as well as fins that have been subjected to such a thinning etch process. The overall size, shape and configuration of the trenches 14 and fins 20 may vary depending on the particular application. The depth 14D and width 14W of the trenches 14 may vary depending upon the particular application. In one illustrative embodiment, based on current day technology, the depth 14D of the trenches 14 may range from approximately 30-150 nm and the width 14W of the trenches 14 may range from about 20-50 nm. In some embodiments, the fins 20 may have a final width 20W within the range of about 5-30 nm. In the illustrative example depicted in FIGS. 1A-1F, the trenches 14 and fins 20 are all of a uniform size and shape. However, such uniformity in the size and shape of the trenches 14 and the fins 20 is not required to practice at least some aspects of the inventions disclosed herein. In the example depicted herein, the trenches 14 are formed by performing an anisotropic etching process that results in the trenches 14 having a schematically depicted, generally rectangular configuration. In an actual real-world device, the sidewalls of the trenches 14 may be somewhat inwardly tapered, although that configuration is not depicted in the drawings. In some cases, the trenches 14 may have a reentrant profile near the bottom of the trenches 14. To the extent the trenches 14 are formed by performing a wet etching process, the trenches 14 may tend to have a more rounded configuration or non-linear configuration as compared to the generally rectangular configuration of the trenches 14 that are formed by performing an anisotropic etching process. Thus, the size and configuration of the trenches 14, and the manner in which they are made, should not be considered a limitation of the present invention. For ease of disclosure, only the substantially rectangular trenches 14 will be depicted in subsequent drawings.

Figure 1B:
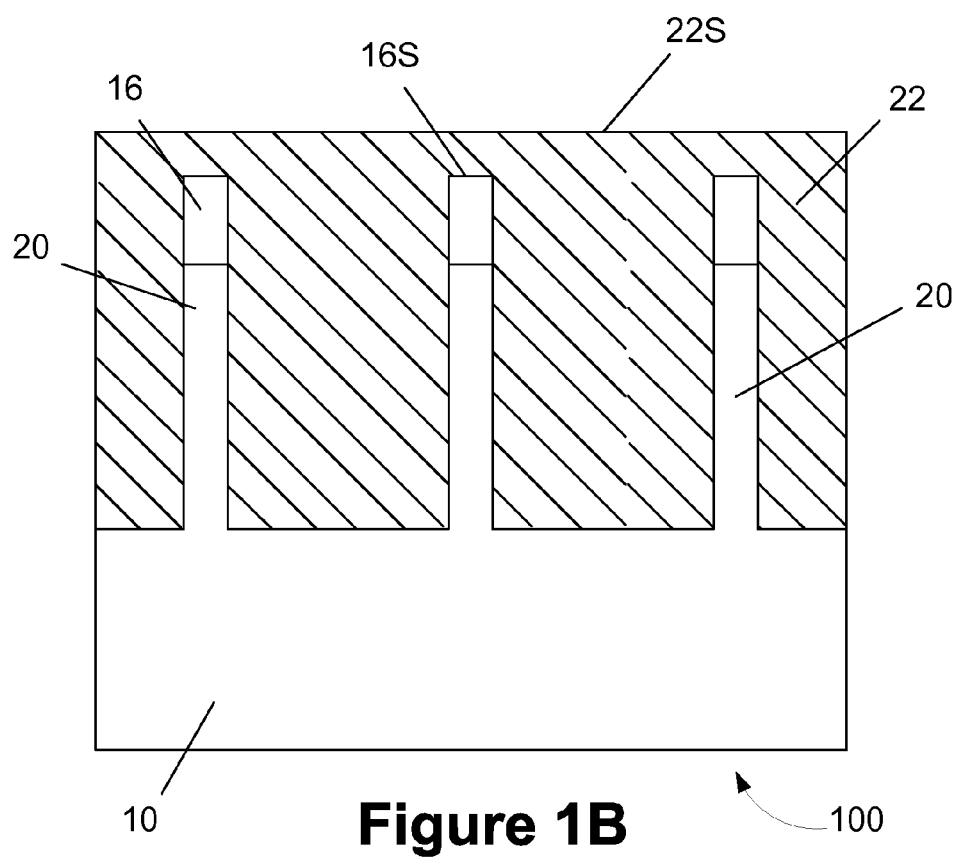

Then, as shown in FIG. 1B, a layer of insulating material 22 is formed in the trenches 14 of the device 100. The layer of insulating material 22 may be comprised of a variety of different materials, such as silicon dioxide, silicon oxynitride, SiCN, etc., and it may be formed by performing a variety of techniques, e.g., chemical vapor deposition (CVD), spin-coating, etc. In one illustrative embodiment, the layer of insulating material 22 may be a flowable oxide material that is formed by performing a CVD process. Such a flowable oxide material is adapted for use with fins 20 of different configurations, even fins 20 with a reentrant profile. In the example depicted in FIG. 1B, the surface 22S of the layer of insulating material 22 is the "as-deposited" surface of the layer 22. In this example, the surface 22S of the layer of insulating material 22 may be positioned slightly above the upper surface 16S of the mask layer 16. Portions of the insulating material 22 will eventually become the local isolation regions between the fins 20.

Figure 1C:
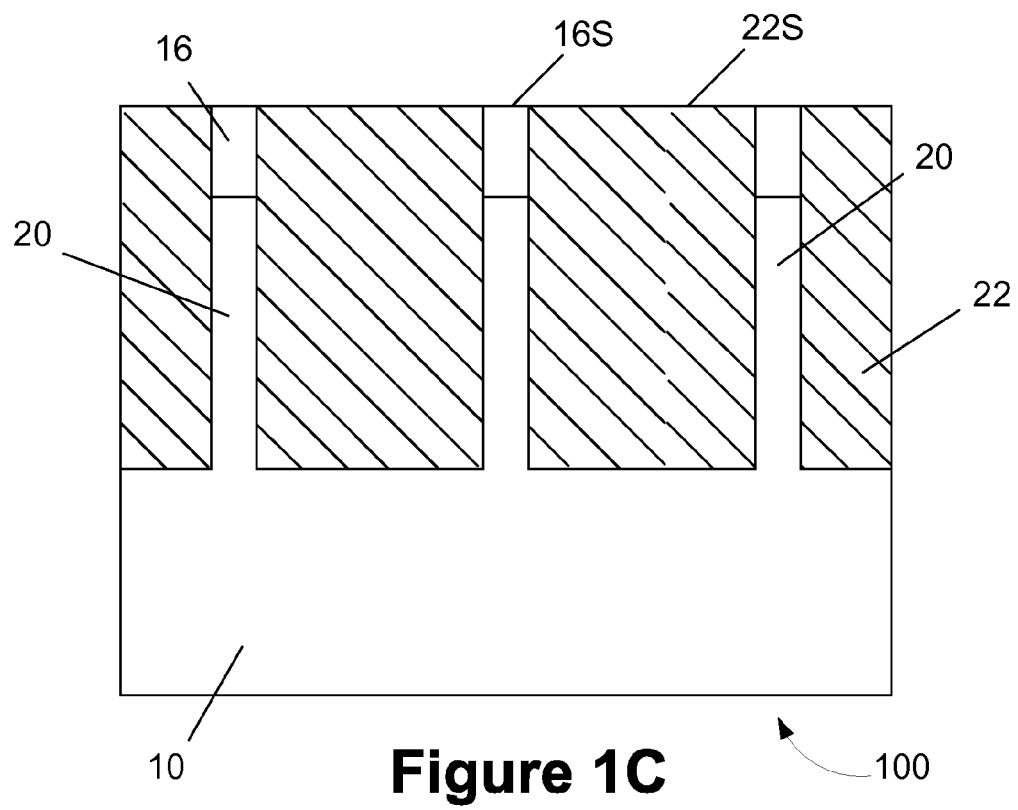

Next, as shown in FIG. 1C, one or more chemical mechanical polishing (CMP) processes may be performed to planarize the surface 22S using the mask layer 16 as a polish stop layer. After such a CMP process, the surface 22S of the layer of insulating material 22 is substantially level with the surface 16S of the mask layer 16.

Figure 1D:
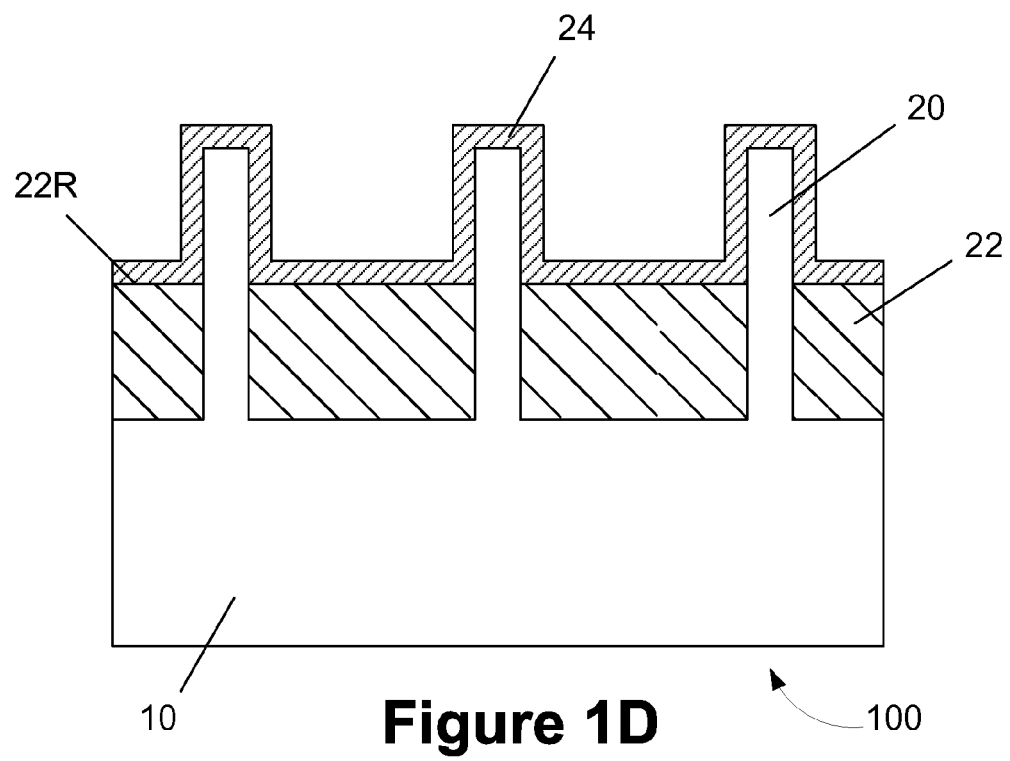

FIG. 1D depicts the device 100 after several process operations have been performed. First, an etching process was performed to reduce the thickness of the layer of insulating material 22. This process resulted in the layer of insulating material having a recessed surface 22R. The recessing of the layer of insulating material 22 defines the approximate finished height of the fins 20 for the completed device. In one illustrative example, the final fin height of the fins 20 may range from about 5-50 nm. Additionally, another etching process was performed to remove the patterned hard mask layer 16. Thereafter, a layer of gate insulating material 24 is conformably deposited on the fins 20 and above the layer of insulating material 22. In one illustrative embodiment, the layer of gate insulating material 24 may be comprised of a material such as, for example, silicon dioxide, silicon nitride, hafnium oxide, a high-k (k value greater than 10) insulating material, etc., it may be formed by performing a variety of known techniques, e.g., atomic layer deposition (ALD), chemical vapor deposition (CVD), etc., and its thickness may vary depending upon the particular application. In one particular example, the layer of gate insulation material 24 may be a layer of high-k insulating material having a thickness of about 2-3 nm.

Figure 1E:
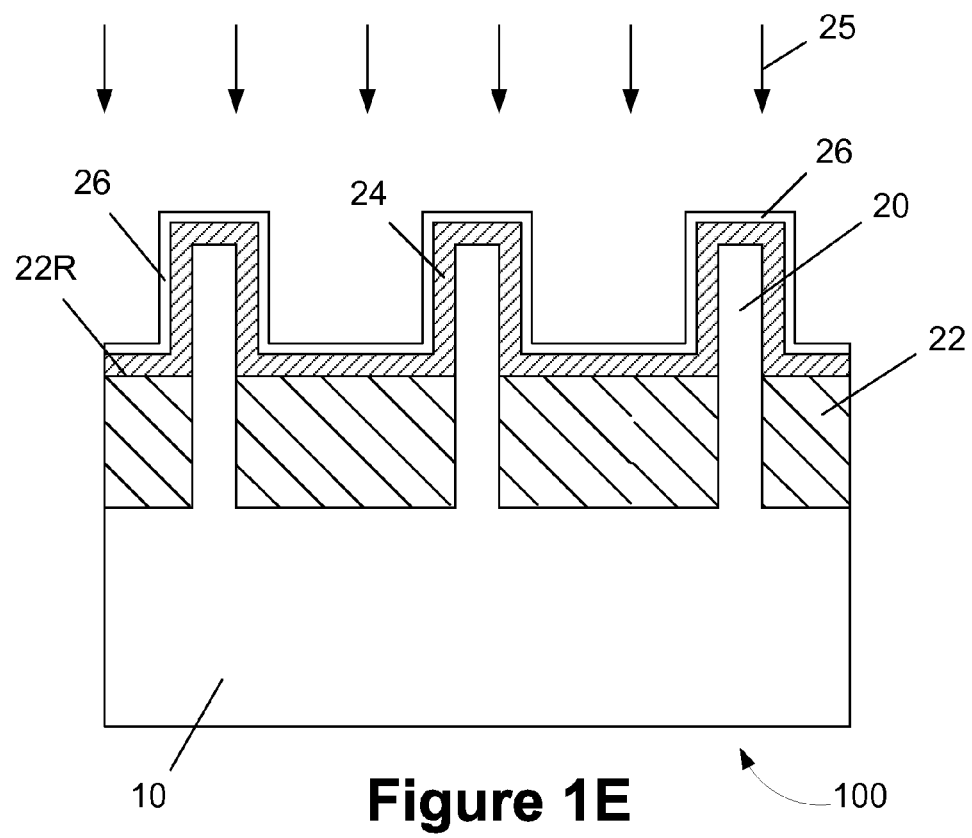

Next, as shown in FIG. 1E, a graphene formation process 25 is performed to form graphene material 26 on the layer of gate insulation material 24. In one illustrative example, the graphene formation process 25 is a spin-coating process wherein graphene colloids are coated on the exposed surfaces, including the exposed surfaces of the layer of gate insulation material 24, and thereafter allowed to dry so as to form the conductive graphene material 26, which may be comprised of one or more monolayers of graphene. In one illustrative example, the graphene material 26 will function as the gate electrode for the FinFET device 100. In one example, the process 25 uses dilute chemically converted graphene and air-sprays them onto the device 100, wherein the process may be performed at room temperature. In general, for relatively small-sized substrates, the graphene colloids may be sprayed on the substrate, while, for larger substrates, the colloids may be applied by a spin-coating process.

After the graphene material 26 is formed, a masking layer, such as a patterned hard mask layer (not shown), may be formed above the channel region of the device 100. Thereafter, portions of the graphene material 26 and the layer of gate insulation material 24 that are not covered by the masking layer may be removed. For example, a plasma-based ashing process may be performed to remove the exposed portions of the graphene material 26 and a dry etching process may thereafter be performed to remove the exposed portions of the layer of gate insulation material 24. Thereafter, sidewall spacers (not shown) may be formed adjacent the gate structure for the device 100, i.e., adjacent the layer of gate insulating material 24 and the graphene gate electrode 26, by depositing a layer of spacer material, e.g., silicon nitride, and thereafter performing an anisotropic etching process.

Figure 1F:
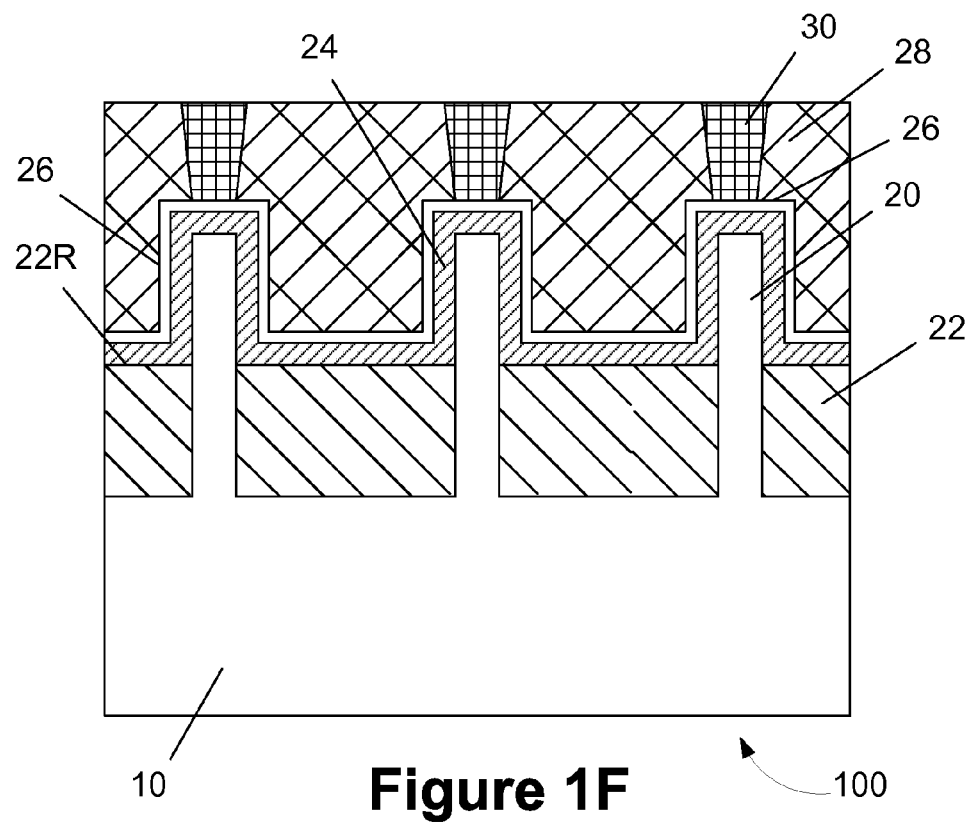

FIG. 1F depicts the device 100 after a layer of insulating material 28 and a plurality of conductive gate contacts 30 have been formed on the device 100. The layer of insulating material 28 may be comprised of a variety of different materials, e.g., silicon dioxide, a low-k insulating material (k value less than about 3), etc., and it may be formed using traditional techniques, e.g., by performing a CVD or ALD process. The conductive gate contacts 30 may be comprised of a variety of different materials, e.g., nickel, titanium, palladium, etc., and they may be formed using traditional techniques used to form conductive contacts, e.g., damascene techniques.

Figure 2A:
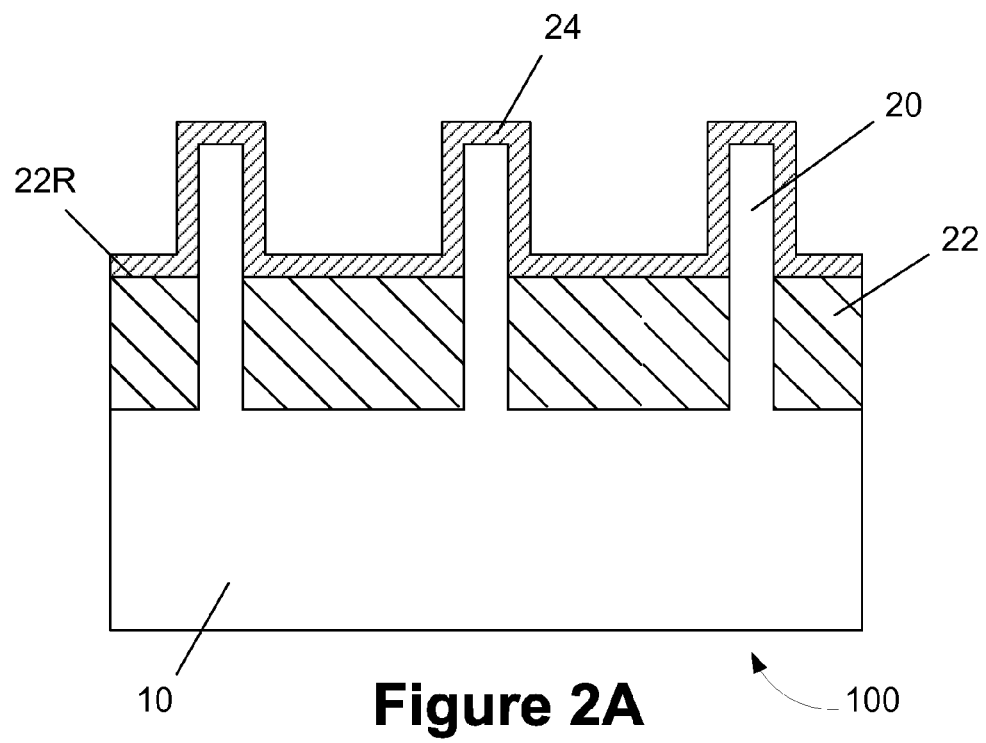
FIGS. 2A-2F depict another illustrative method disclosed herein of forming a FinFET device with a gate electrode comprised of graphene.

FIGS. 2A-2F depict another illustrative method disclosed herein of forming a FinFET device 100 with a gate electrode comprised of graphene. FIG. 2A depicts the FinFET device 100 at the point of fabrication that corresponds to that shown in FIG. 1D. That is, the layer of insulating material 22 has been recessed and the layer of gate insulation material 24 has been formed as previously described.

Figure 2B:
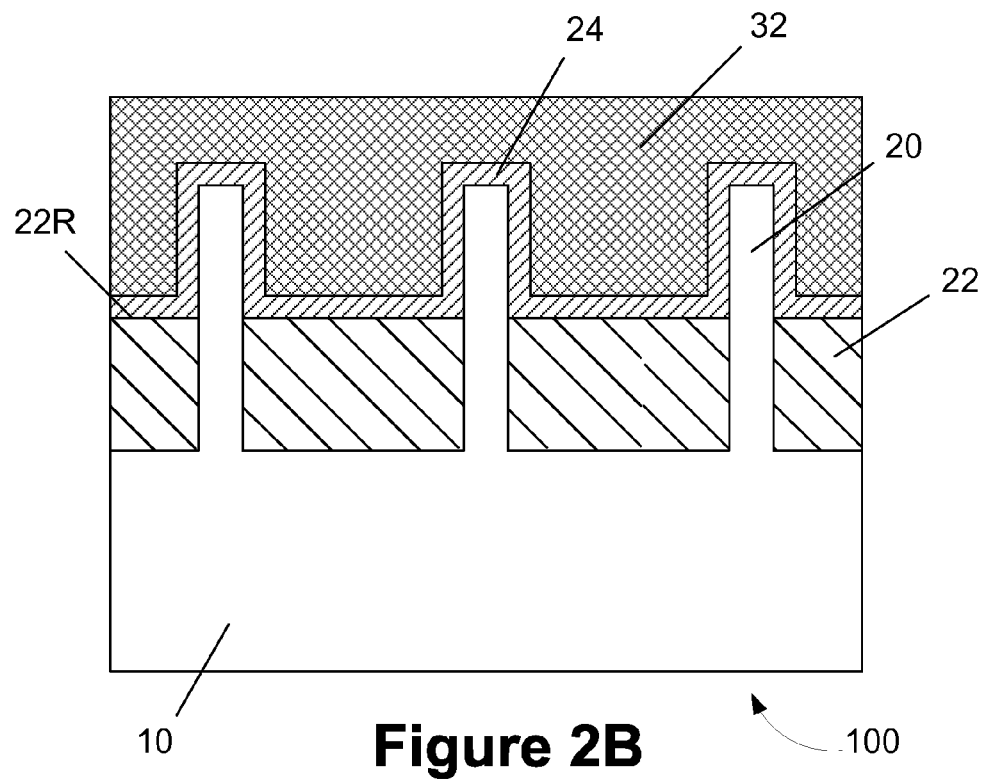

In this illustrative process flow, as shown in FIG. 2B, a layer of metal or a metal alloy 32 is formed on the gate insulation layer 24. The layer 32 may be made of any type of metal, copper, aluminum, nickel, tungsten, etc., and it may be formed by performing a variety of known techniques, e.g., electroplating, physical vapor deposition, etc. To the extent that any barrier and/or seed layers are employed in forming the layer 32, those layers are not depicted in the drawings so as not to obscure the presentation of the various inventions disclosed herein. As an example, in the case where the metal or metal alloy 32 is comprised of copper, a barrier layer (not shown) of, for example, tantalum may be formed prior to formation of the copper metal or metal alloy so as to reduce or prevent migration of copper.

Figure 2C:
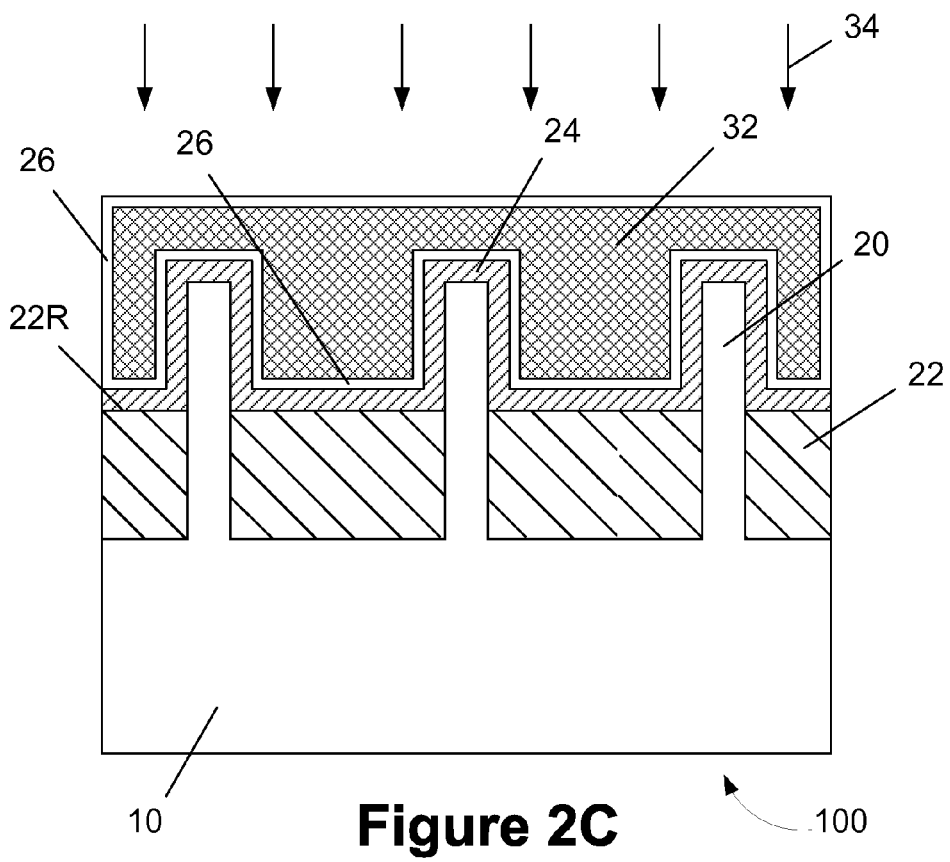

Next, as shown in FIG. 2C, a graphene growth formation process 34 is performed to form one or more monolayers of graphene material 26. In this illustrative embodiment, the graphene formation process 34 is a selective CVD-based growth process, whereby the graphene material 26 forms on the outer surfaces of the layer of metal 32, even where the outer surface of the layer of metal 32 is resting on the layer of gate insulating material 24. In one illustrative example, the graphene growth formation process 34 may be a CVD-based process that is performed for a duration of approximately 25 minutes at a temperature within the range of about 900-1000° C., at a pressure of about 500 mTorr using a flow rate of about 35 sscm of methane ($CH_4$).

At this point, the work function of the graphene material 26 may be adjusted by depositing appropriate so-called SAMs (self-assembled monolayers). In one illustrative embodiment, SAMs such as amine ($NH_2$) or methyl ($CH_3$), etc., are used to adjust the work function of the graphene material 26. In general, a SAM such as amine effectively donates electrons to the graphene material while a SAM effectively attracts or removes electrons from the graphene material 26.

Figure 2D:
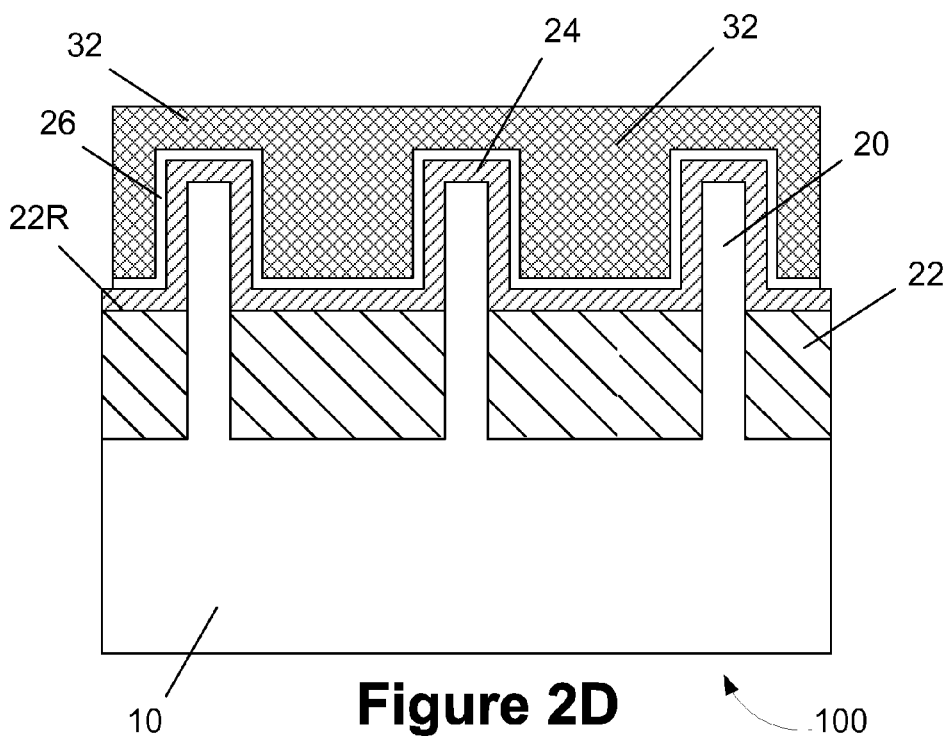
Figure 2E:
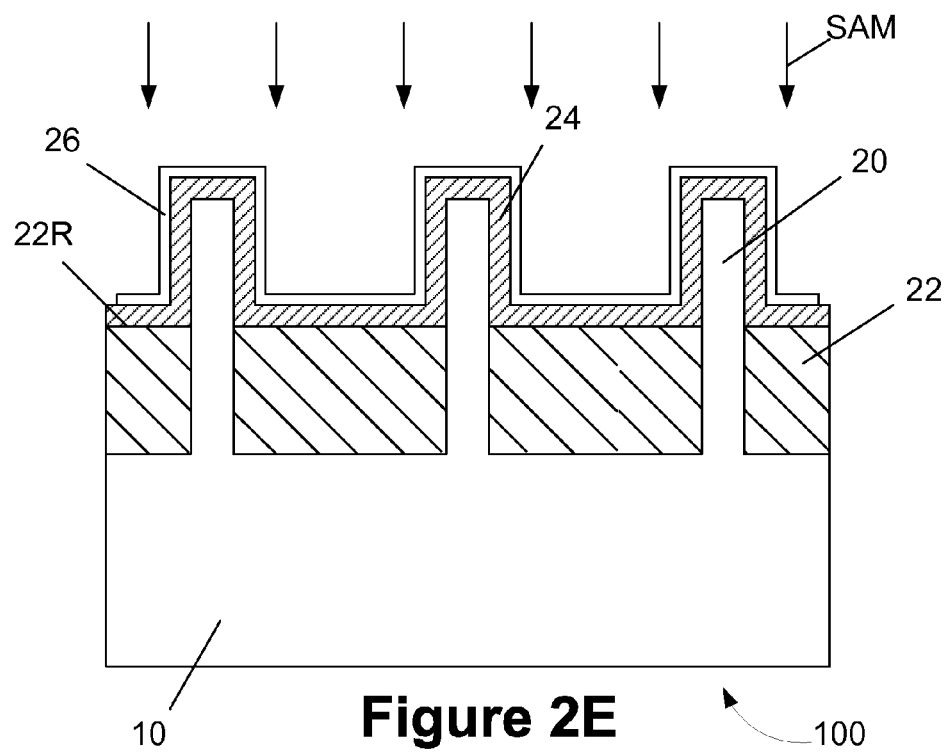
Figure 2F:
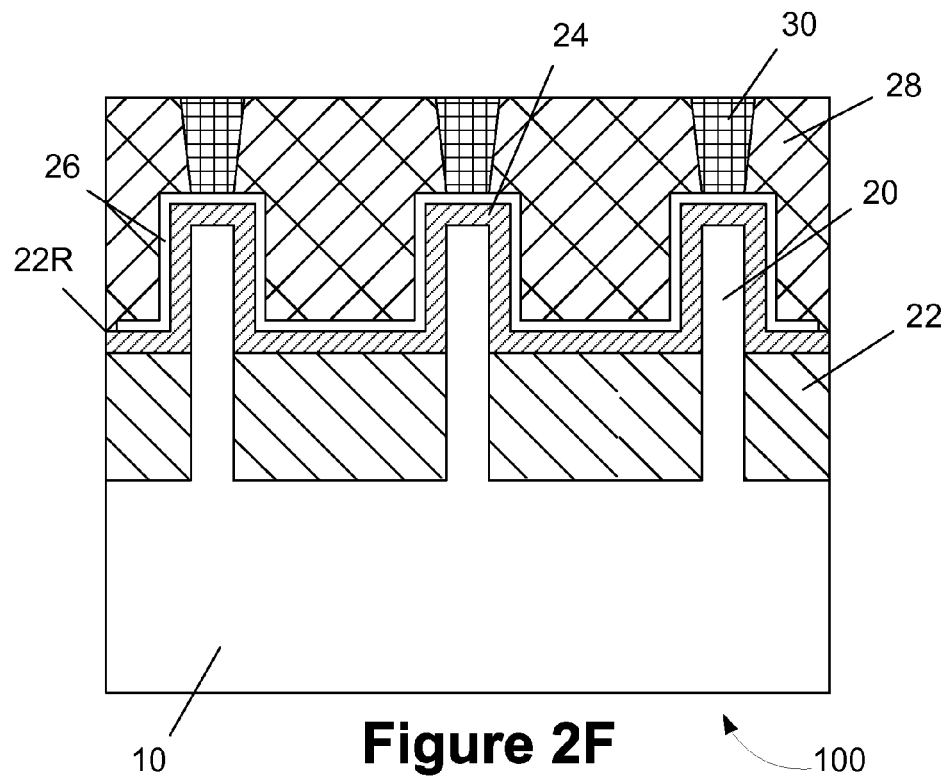

Then, as shown in FIG. 2D, a plasma-based ashing process may be performed to remove the exposed portions of the graphene material 26 selectively relative to the layer of metal 32. FIG. 2E depicts the device 100 after a dry or wet etching process has been performed to remove the exposed layer of metal 32 selectively relative to the graphene material 26. This leaves the remaining portions of the graphene material 26 on the layer of gate insulation material 24. The work function of the graphene material 26 may then be adjusted by depositing one or more SAMs, as described above. Then, as before, a masking layer, such as a patterned hard mask layer (not shown), may be formed above the channel region of the device 100. Thereafter, portions of the graphene material 26 and the layer of gate insulation material 24 that are not covered by the masking layer may be removed. For example, a plasma-based ashing process may be performed to remove the exposed portions of the graphene material 26 and a dry etching process may thereafter be performed to remove the exposed portions of the layer of gate insulation material 24. Thereafter, sidewall spacers (not shown) may be formed adjacent the gate structure for the device 100, i.e., adjacent the layer of gate insulating material 24 and the graphene gate electrode 26, by depositing a layer of spacer material, e.g., silicon nitride, and thereafter performing an anisotropic etching process. FIG. 2F depicts the device 100 after the layer of insulating material 28 and the plurality of conductive gate contacts 30 have been formed on the device 100, as previously described.

Figure 3A:
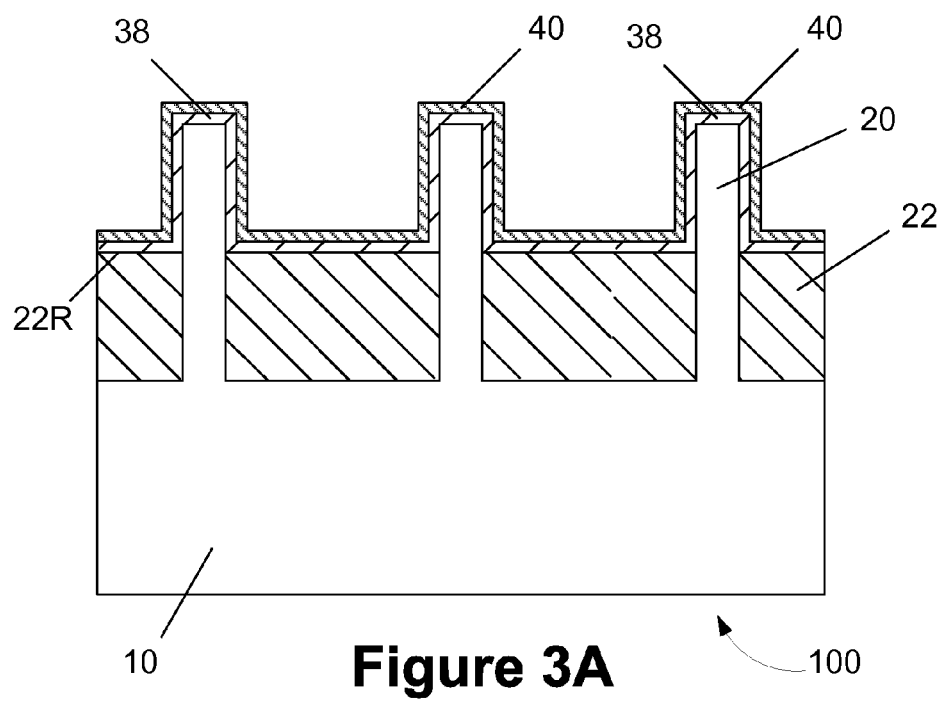
FIGS. 3A-3L depict yet another illustrative method disclosed herein of forming a FinFET device with a gate electrode comprised of graphene.

FIGS. 3A-3L depict yet another illustrative method disclosed herein of forming a FinFET device 100 with a gate electrode comprised of graphene. FIG. 3A depicts the FinFET device 100 at the point of fabrication after several process operations have been performed. First, the fins 20 and the layer of insulating material 22 were formed and the layer of insulating material 22 was recessed as described previously, in connection with the process flow described previously up to the point depicted in FIG. 1D. Next, a layer of insulating material 38 is conformably deposited on the device 100. In one illustrative embodiment, the layer of insulating material 38 may be comprised of a material such as, for example, silicon dioxide, etc., it may be formed by performing a variety of known techniques, e.g., ALD, CVD, etc., and its thickness may vary depending upon the particular application. In one particular example, the layer of insulation material 38 may be a layer of silicon dioxide having a thickness of about 1-2 nm. Thereafter, another layer of insulating material 40 is conformably deposited on the layer of insulating material 38. In general, the layer of insulating material 40 should be made of a material that is selectively etchable relative to the layer of insulating material 38. In one illustrative embodiment, the layer of insulating material 40 may be a layer of silicon nitride having a thickness of about 1-5 nm, and it may be formed by performing, for example, an ALD process.

Figure 3B:
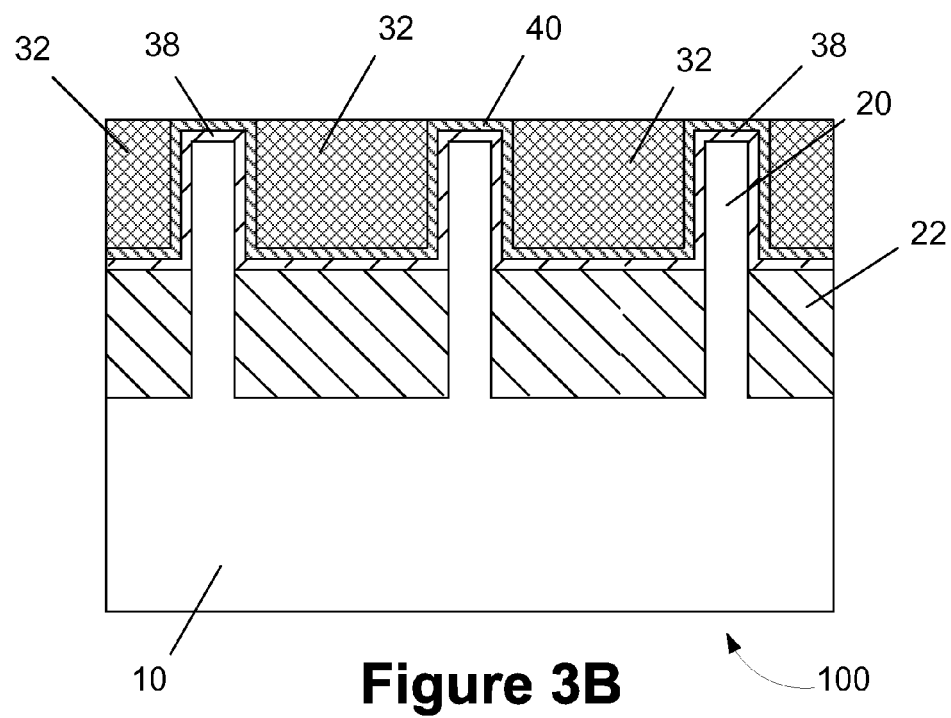

Next, as shown in FIG. 3B, the previously described layer of metal or a metal alloy 32 is formed on the device 100. As noted previously, to the extent that any barrier and/or seed layers are employed in forming the layer 32, those layers are not depicted in the drawings so as not to obscure the presentation of the various inventions disclosed herein. The metal layer 32 may be formed by directly depositing the metal layer 32 so as to overfill the trenches and thereafter performing a CMP process to remove excess portions of the layer of metal 32.

Figure 3C:
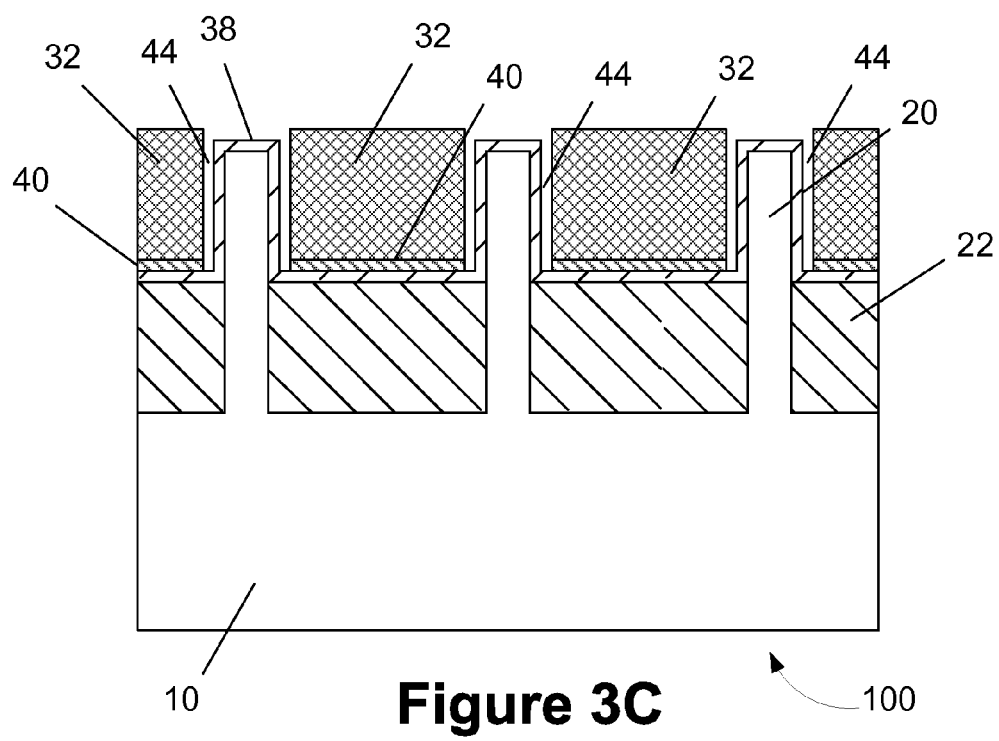

Then, as shown in FIG. 3C, an etching process, such as a wet etching process, is performed to remove exposed portions of the layer of insulating material 40 relative to the layer of metal 32 and the layer of insulating material 38. This process results in the definition of a plurality of cavities 44, i.e., regions that were formerly occupied by the layer of insulating material 40.

Figure 3D:
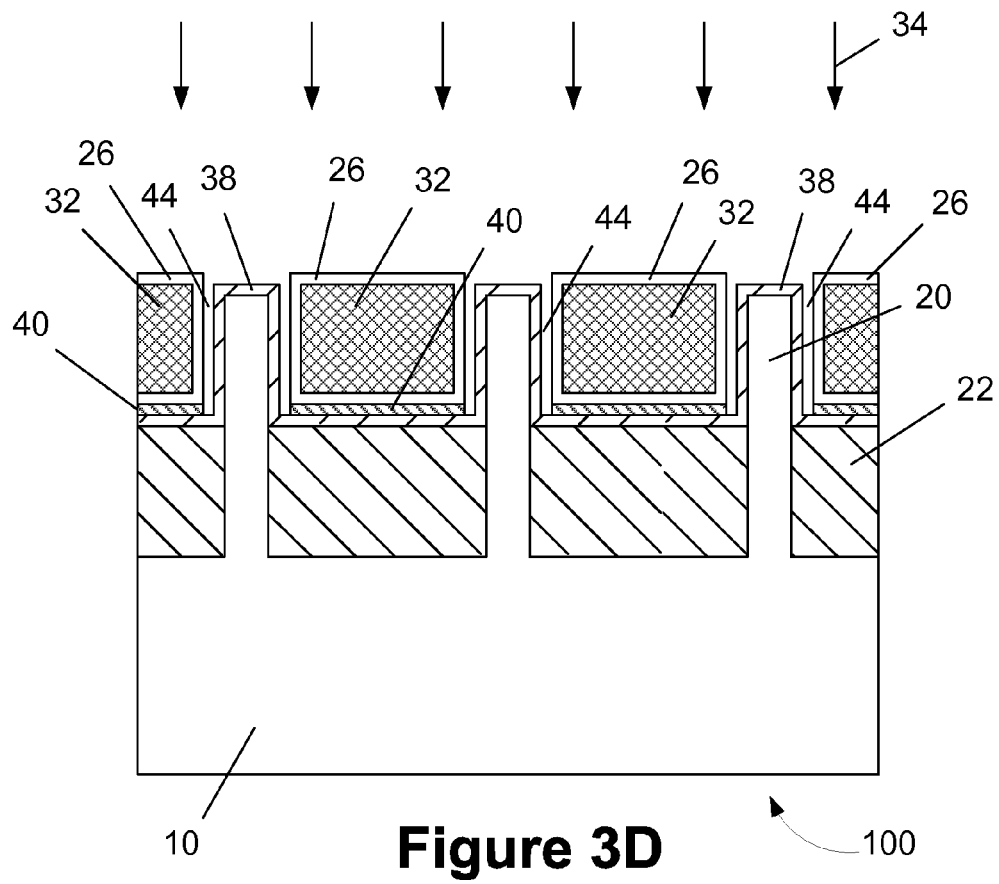

Next, as shown in FIG. 3D, the previously described graphene formation process 34 is performed to form one or more monolayers of graphene material 26. As noted before, the graphene formation process 34 is a selective CVD-based growth process, whereby the graphene material 26 forms on the outer surfaces of the layer of metal 32, even where the outer surface of the layer of metal 32 is resting on the layer of insulating material 40. The work function of the graphene material 26 may then be adjusted by depositing one or more SAMs, as described above.

Figure 3E:
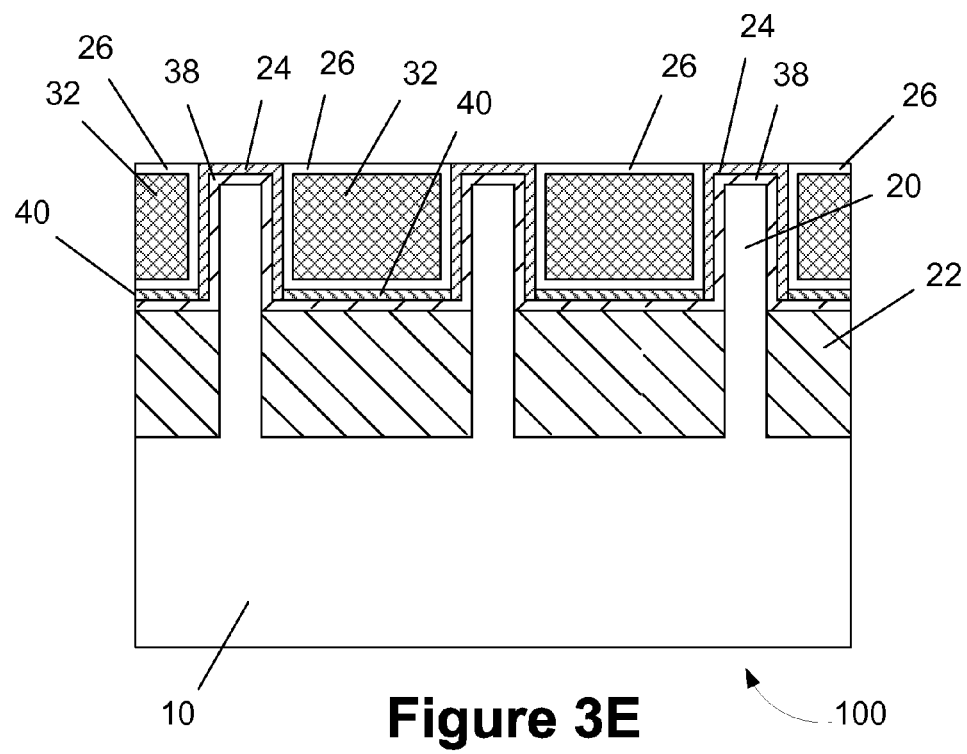

Then, as shown in FIG. 3E, a conformable deposition process, e.g., an ALD process, is performed to form the previously described layer of gate insulating material 24 in the cavities 44 (between the layer of insulating material 40 and the graphene material 26) and above the fins 20. As part of this deposition process, portions of the layer of gate insulating material 24 may form above portions of the metal layer 32, and they may be removed by performing a CMP process using the metal layer 32 as a polish stop layer.

Figure 3F:
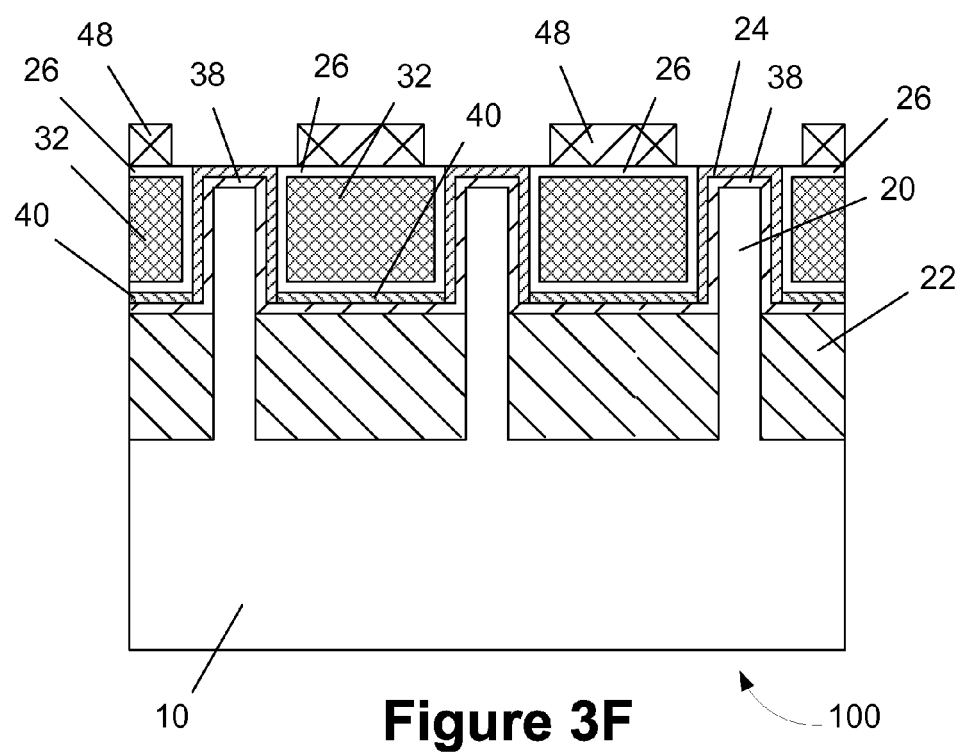

Thereafter, as shown in FIG. 3F, a patterned mask layer 48, such as a patterned hard mask layer, is formed above the device 100 so as to expose regions above the fins 20. The patterned mask layer 48 may be comprised of a variety of materials, e.g., silicon dioxide, and it may be formed using traditional deposition, photolithography and etching tools and techniques.

Figure 3G:
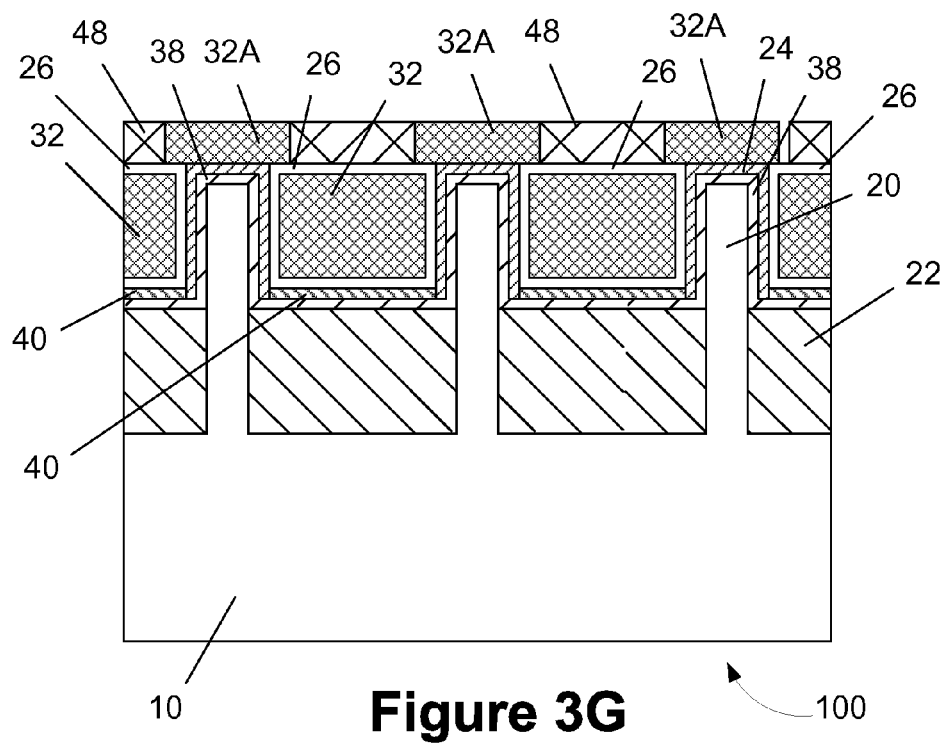

Next, as shown in FIG. 3G, another layer of metal 32A that is similar to the previously described layer of metal or a metal alloy 32 is formed on the device 100. As noted previously, to the extent that any barrier and/or seed layers are employed in forming the layer 32A, those layers are not depicted in the drawings so as not to obscure the presentation of the various inventions disclosed herein. The metal layer 32A may be formed by directly depositing the metal layer 32A so as to overfill the trenches defined by the patterned mask layer 48 and thereafter performing a CMP process to remove excess portions of the layer of metal 32A using the patterned mask layer 48 as a polish stop layer.

Figure 3H:
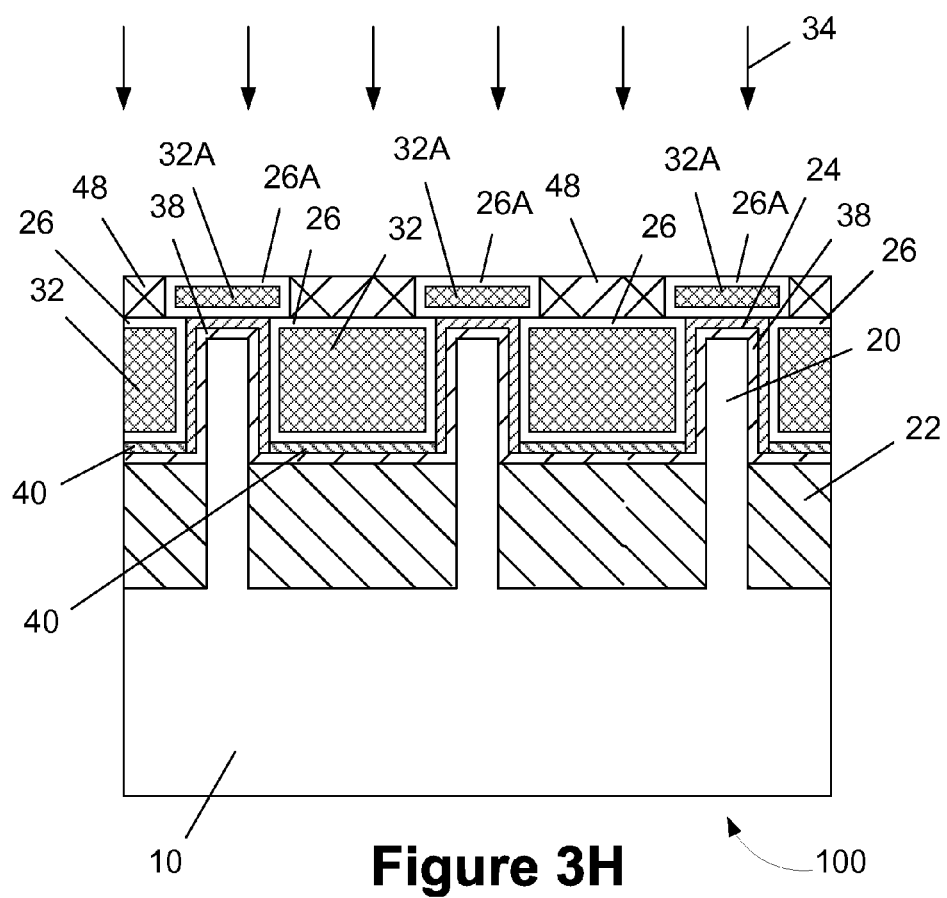

Next, as shown in FIG. 3H, the previously described graphene formation process 34 is performed yet again to form one or more monolayers of graphene material 26A. As noted before, the graphene formation process 34 is a selective CVD-based growth process, whereby the graphene material 26 forms on the outer surfaces of the layer of metal 32A, even where the outer surface of the layer of metal 32A is resting on the layer of gate insulating material 24. The graphene material 26A conductively contacts the graphene material 26.

Figure 3I:
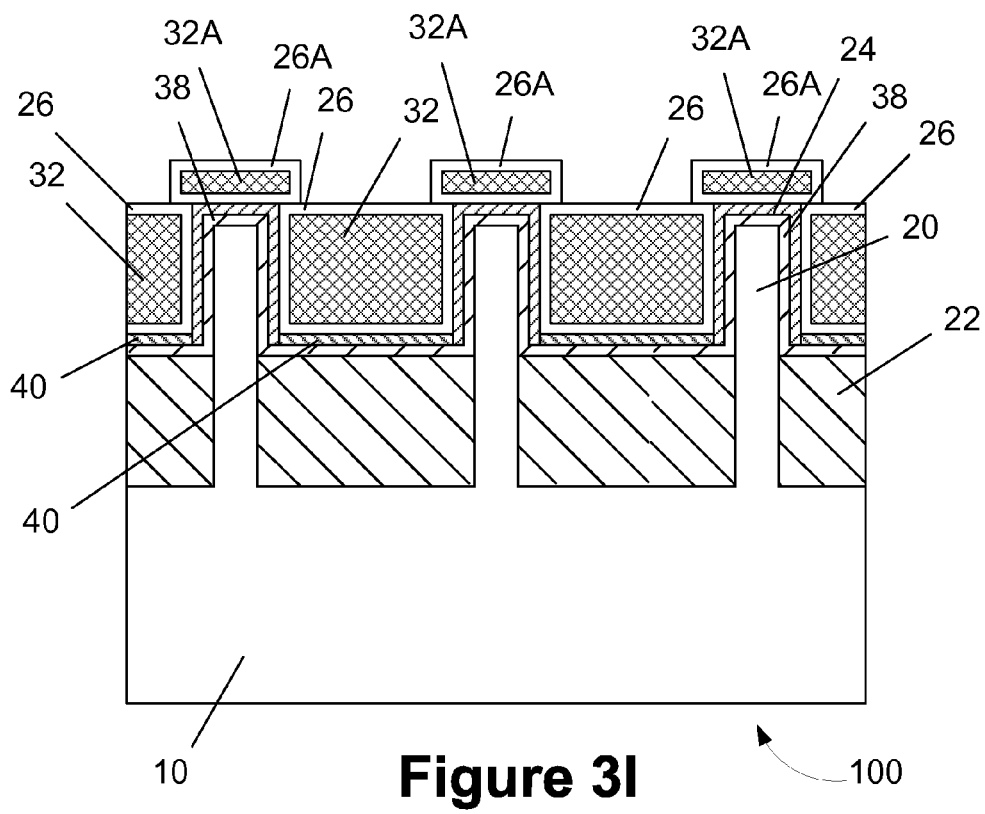

Then, as shown in FIG. 3I, an etching process, such as a wet etching process, is performed to remove the patterned mask layer 48 selectively relative to all adjacent materials.

Figure 3J:
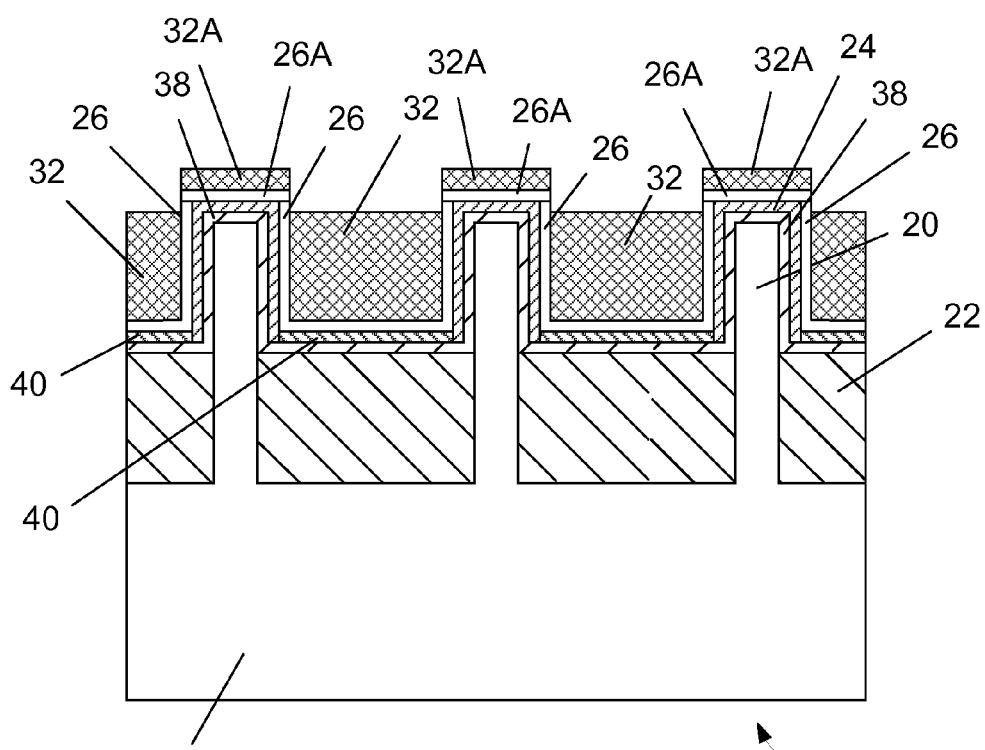

Next, as shown in FIG. 3J, a plasma-based ashing process may be performed to remove the exposed portions of the graphene materials 26A and 26 selectively relative to the layers of metal 32A, 32. The process exposes the layers of metal 32A, 32 for further processing. For example, at this point, the work function of the residual portions of the layers of metal (or metal alloy) 32A, 32 may be adjusted by depositing one or more of the SAMs identified above.

Figure 3K:
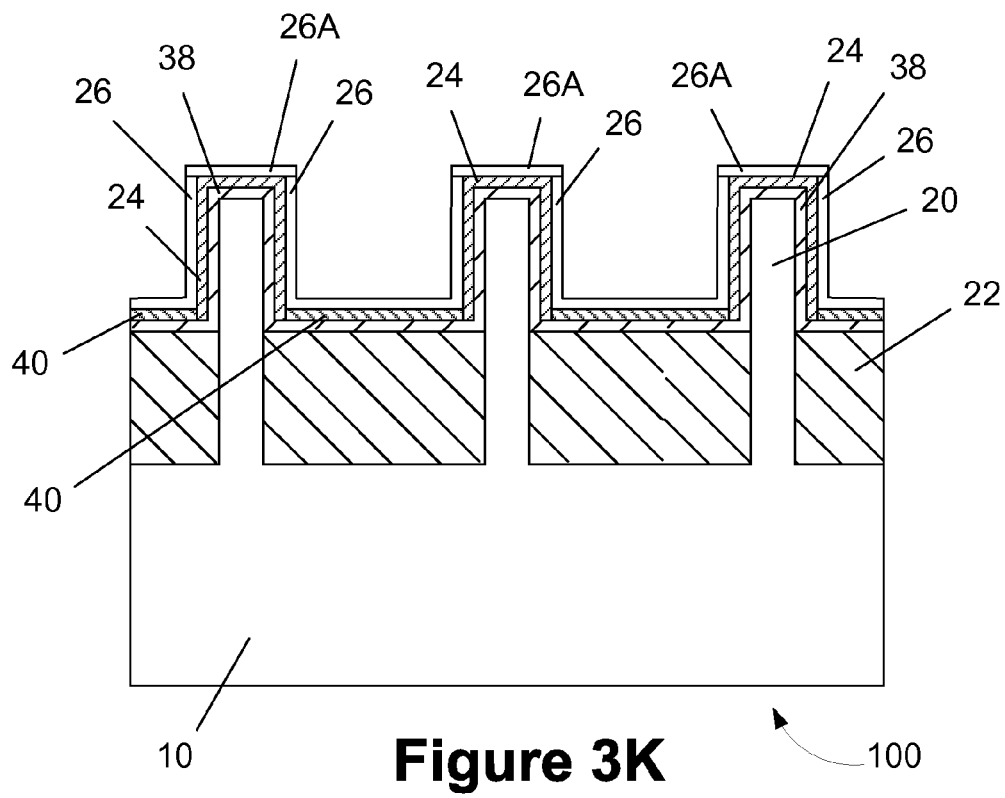
Figure 3L:
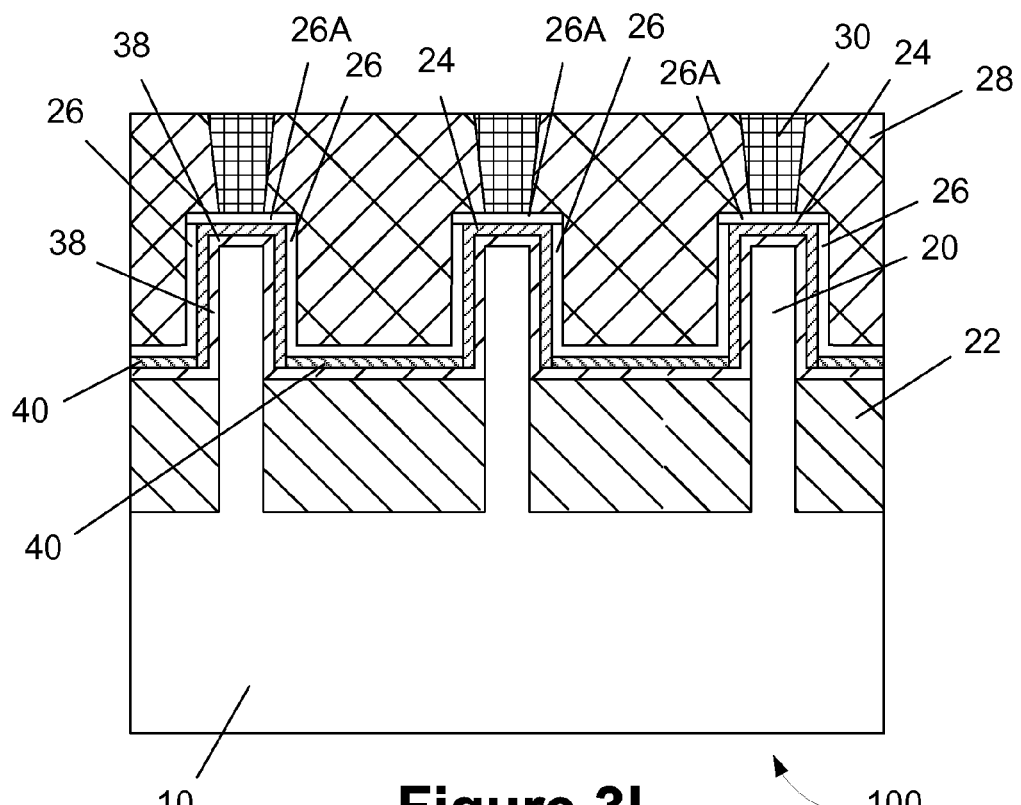

FIG. 3K depicts the device 100 after a dry or wet etching process has been performed to remove the exposed portions of the layers of metal 32A, 32 selectively relative to the graphene materials 26A, 26. This leaves the remaining portions of the graphene materials 26A, 26 positioned on the layer of gate insulation material 24. Then, as before, a masking layer, such as a patterned hard mask layer (not shown), may be formed above the channel region of the device 100. Thereafter, portions of the graphene materials 26A, 26 and the layer of gate insulation material 24 that are not covered by the masking layer may be removed. For example, a plasma-based ashing process may be performed to remove the exposed portions of the graphene materials 26A, 26 and a dry etching process may thereafter be performed to remove the exposed portions of the layer of gate insulation material 24. Thereafter, sidewall spacers (not shown) may be formed adjacent the gate structure for the device 100, i.e., adjacent the layer of gate insulating material 24 and the graphene gate electrode materials 26A, 26, by depositing a layer of spacer material, e.g., silicon nitride, and thereafter performing an anisotropic etching process. FIG. 3L depicts the device 100 after the layer of insulating material 28 and the plurality of conductive gate contacts 30 have been formed on the device 100, as previously described.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method for forming a FinFET device, comprising:
   forming at least one fin in a semiconducting substrate;
   forming a layer of gate insulation material adjacent said fin;
   forming a gate electrode comprised of graphene, wherein at least said layer of gate insulation material is positioned between said gate electrode and said fin and wherein forming the gate electrode comprises:
      forming a first portion of graphic material on said gate insulation material and a second portion of graphene material positioned vertically above and spaced apart from the first portion of graphene material:
      performing at least one patterning process to remove at least portions of the second portion of graphene material to thereby define said gate electrode comprised of said first portion of graphene material; and
   forming an insulating material on said gate electrode.

2. The method of claim 1, wherein forming said at least one fin comprises performing at least one etching process through a patterned mask layer to define a plurality of trenches in said substrate, wherein said trenches define said fin.

3. The method of claim 1, wherein the step of forming said layer of gate insulation material is performed prior to the step of forming said gate electrode.

4. The method of claim 1, wherein the step of forming said layer of gate insulation material is performed after the step of forming said gate electrode.

5. The method of claim 1, wherein forming said gate insulation layer comprises forming said gate insulation layer above an upper surface and two side surfaces of said fin.

6. The method of claim 1, wherein forming said gate insulation layer comprises forming said gate insulation layer on an upper surface and two side surfaces of said fin.

7. The method of claim 1, wherein forming said gate insulation layer comprises forming said gate insulation layer from a high-k insulating material.

8. The method of claim 1, further comprising depositing a self-aligned monolayer material on said gate electrode.

9. The method of claim 8, wherein said self-aligned monolayer material is one of amine ($NH_2$) or methyl ($CH_3$).

10. The method of claim 1, wherein forming said gate electrode comprises performing a spin-coating process to deposit graphene colloids above said layer of gate insulation material.

11. A method for forming a FinFET device, comprising:
    forming at least one fin in a semiconducting substrate;
    forming a layer of gate insulation material on said fin;
    forming a layer of metal or a metal alloy on said layer of gate insulation material;
    performing a chemical deposition process to form at least one monolayer of graphene material on outer surfaces of said layer of metal or metal alloy;
    removing portions of said graphene material to thereby expose remaining portions of said layer of metal or metal alloy that are positioned above a residual portion of said graphene material;
    removing said exposed portions of said metal or metal alloy to thereby expose said residual portion of said graphene material;
    performing at least one patterning process to remove at least portions of said exposed residual portion of said graphene material; away from a channel region of said FinFET device to thereby define a gate electrode comprised of said graphene material; and forming an insulating material above said gate electrode.

12. A method for forming a FinFET device, comprising:
forming at least one fin in a semiconducting substrate;
forming a layer of gate insulation material adjacent said fin;
forming a gate electrode comprised of graphene, wherein at least said layer of gate insulation material is positioned between said gate electrode and said fin, and wherein forming the gate electrode comprises:
   forming a layer of metal or a metal alloy on said layer of gate insulation material;
   performing a chemical deposition process to form graphene material on outer surfaces of said layer of metal or metal alloy;
   removing portions of said graphene material to thereby expose remaining portions of said layer of metal or metal alloy that are positioned above a residual portion of said graphene material;
   removing said exposed portions of said metal or metal alloy to thereby expose said residual portion of said graphene material; and
   performing at least one patterning process to remove at least portions of said exposed residual portion of said graphene material to thereby define said gate electrode comprised of said graphene material; and
forming an insulating material on said gate electrode.

13. A method for forming a FinFET device, comprising:
forming at least one fin in a semiconducting substrate;
forming a layer of gate insulation material on said fin;
forming a gate electrode comprised of graphene, wherein at least said layer of gate insulation material is positioned between said gate electrode and said fin, and wherein forming the gate electrode comprises:
   forming a sacrificial material layer adjacent opposite sides of said fin;
   forming a first layer of metal or a metal alloy on opposite sides of said fin adjacent said sacrificial material layer;
   performing at least one etching process to remove said sacrificial material positioned between said first layer of metal and said fin to thereby define a cavity between said first layer of metal or metal alloy on each side of said fin;
   performing a first chemical deposition process to form a first graphene material on outer surfaces of said first layer of metal or metal alloy within said trenches between said fin and said first layer of metal or metal alloy;
   forming said gate insulation material on said first graphene material within said trench and above an upper surface of said fin;
   forming a second layer of metal or a metal alloy above an upper surface of said fin, said second layer of metal or metal alloy being conductively coupled to said first graphene material that is positioned on opposite sides of said fin;
   performing a second chemical deposition process to form a second graphene material on outer surfaces of said second layer of metal or metal alloy, wherein said second graphene material is conductively coupled to said first graphene material that is positioned on opposite sides of said fin;
   removing portions of said first and second graphene materials to thereby expose remaining portions of said first and second layers of metal or metal alloy and to thereby define residual portions of said first and second graphene materials;
   removing said exposed portions of said first and second layers of metal or metal alloy to thereby define said gate electrode comprised of said residual portions of said first and second graphene materials; and
forming an insulating material on said gate electrode.

14. The method of claim 1, wherein forming said FinFET device further comprises forming at least one conductive contact positioned in said layer of insulating material that is conductively coupled to said gate electrode.

* * * * *

UNITED STATES PATENT AND TRADEMARK OFFICE
CERTIFICATE OF CORRECTION

Page 1 of 1

PATENT NO.        : 8,815,739 B2
APPLICATION NO.   : 13/545621
DATED             : August 26, 2014
INVENTOR(S)       : Krivokapic et al.

It is certified that error appears in the above-identified patent and that said Letters Patent is hereby corrected as shown below:

In the Claims,

In claim 1, at column 10, line 14, delete "graphic" and insert therefor -- graphene --.

In claim 1, at column 10, line 15, delete "grapheme" and insert therefor -- graphene --.

In claim 1, at column 10, line 17, delete "material:" and insert therefor -- material; --.

In claim 1, at column 10, line 19, delete "grapheme" and insert therefor -- graphene --.

In claim 1, at column 10, line 21, delete "grapheme" and insert therefor -- graphene --.

In claim 11, at column 10, line 67, delete "material; away" and insert therefor -- material away --.

Signed and Sealed this
Sixteenth Day of December, 2014

Michelle K. Lee
*Deputy Director of the United States Patent and Trademark Office*